(12) United States Patent
Durman et al.

(10) Patent No.: US 9,187,828 B2
(45) Date of Patent: Nov. 17, 2015

(54) COATED FILAMENTS AND THEIR MANUFACTURE

(75) Inventors: Ray Paul Durman, Wokingham (GB);
Robert Alan Shatwell, Farnham (GB);
Stephen John Kyle-Henney, Leatherhead (GB); Renny Neil Moss, Ashtead (GB); Robert Slightam, Woking (GB)

(73) Assignee: Tisics Limited, Hampshire (GB)

( * ) Notice: Subject to any disclaimer, the term of this patent is extended or adjusted under 35 U.S.C. 154(b) by 1575 days.

(21) Appl. No.: 12/231,089

(22) Filed: Aug. 29, 2008

(65) Prior Publication Data
US 2010/0047574 A1 Feb. 25, 2010

(30) Foreign Application Priority Data
Aug. 22, 2008 (GB) .................... 0815283.7

(51) Int. Cl.
*C23C 16/54* (2006.01)
*C23C 16/44* (2006.01)

(52) U.S. Cl.
CPC ........... *C23C 16/545* (2013.01); *C23C 16/4409* (2013.01); *Y10T 428/2933* (2015.01)

(58) Field of Classification Search
USPC .................................................. 118/718, 733
See application file for complete search history.

(56) References Cited

U.S. PATENT DOCUMENTS

| | | | |
|---|---|---|---|
| 3,409,469 A * | 11/1968 | Kuntz | 427/587 |
| 3,549,413 A * | 12/1970 | Withers et al. | 428/389 |
| 3,598,955 A | 8/1971 | Morelock | |
| 3,622,369 A | 11/1971 | Basche et al. | 117/46 CG |
| 3,865,074 A * | 2/1975 | Cornelissen et al. | 118/718 |
| 4,031,851 A * | 6/1977 | Camahort | 118/718 |
| 4,127,659 A | 11/1978 | DeBolt et al. | 427/249 |
| 4,357,365 A | 11/1982 | McCarty | |
| 5,135,554 A | 8/1992 | Rogers, Jr. et al. | 65/3.3 |
| 5,543,605 A | 8/1996 | Kimrey, Jr. et al. | 219/690 |
| 5,665,165 A * | 9/1997 | Spencer et al. | 118/718 |
| 6,391,396 B1 | 5/2002 | Barmatz et al. | 427/575 |

FOREIGN PATENT DOCUMENTS

| | | | |
|---|---|---|---|
| DE | 4335573 | 4/1995 | |
| EP | 0 396 332 | 11/1990 | C23C 16/30 |
| EP | 0 396 333 | 11/1990 | C23C 16/32 |
| EP | 0 450 760 | 10/1991 | C23C 16/26 |
| EP | 0 552 951 A1 | 7/1993 | H05B 6/78 |
| EP | 0 598 491 | 5/1994 | C23C 16/32 |
| EP | 0 770 703 A2 | 5/1997 | C23C 14/56 |
| GB | 363236 | 12/1931 | |

(Continued)

*Primary Examiner* — Karla Moore
(74) *Attorney, Agent, or Firm* — Volpe and Koenig, P.C.

(57) ABSTRACT

A coating is formed by chemical vapor deposition an electrically heated filament which is passed through an end plate into a deposition chamber and leaves the deposition chamber through a similar end plate. The filament slides through an entrance passage into the deposition chamber. The entrance passage is formed from misaligned portions which press the filament into direct electrical contact with their walls. A tube communicates with a chamber between the ends of the passage and acts as a sealing means to prevent gas escaping from the deposition chamber through the entrance passage. The end plate operates in exactly the same manner. As no mercury or a low-melting point eutectic alloy is used, no contaminants associated therewith are produced and the resultant coated filament is free of such contaminants.

13 Claims, 2 Drawing Sheets

(56) References Cited

FOREIGN PATENT DOCUMENTS

| GB | 1355798 A | 6/1974 | ............. C23C 14/54 |
| GB | 1405746 | 9/1975 | |
| GB | 2462846 A | * 2/2010 | |

* cited by examiner

COATED FILAMENTS AND THEIR MANUFACTURE

RELATED APPLICATION

The present Application is related to Ser. No. 12/231,090 for "Coated Filaments And Their Manufacture," filed on Aug. 29, 2008. Also this Application claims foreign priority benefits under 35 U.S.C. 119 of prior United Kingdom Application No. 0815283.7, filed on Aug. 22, 2008, the entire disclosure of which is incorporated herein by reference.

FIELD OF THE INVENTION

This invention relates to coated filaments, and to an apparatus and a method for their formation.

BACKGROUND TO THE INVENTION

It is well known to deposit a coating on an electrically conductive filament using chemical vapour deposition techniques. Typically the electrically conductive filament is passed continuously through a deposition chamber containing an appropriate gas or gases whilst the filament is heated by the passage of an electrical current, and the gas or gases deposit a coating on the hot filament. This is a process of "chemical vapour deposition" or CVD and essentially requires the provision of gas seals around the electrical contacts to the filament at both ends of the deposition chamber.

EP 0 396 333 teaches that silicon carbide may be coated on a tungsten filament which passes through electrodes at the ends of a deposition chamber, the entrance electrode is a pool of mercury and the exit electrode is a mercury/indium amalgam. The pool of mercury and the mercury/indium amalgam both serve the dual function of providing a gas seal around and an electrical contact to the tungsten filament.

U.S. Pat. No. 3,622,369 and U.S. Pat. No. 4,127,659 both describe similar processes for depositing silicon carbide on a filament.

EP 0 396 332 teaches that an exit electrode for a ceramically coated filament should, instead of using mercury, utilise a liquid metal mixture of mercury/indium or mercury/cadmium amalgam or a gallium/indium mixture.

EP 0 450 760 teaches that carbon may be coated on a filament which comprises a tungsten core coated with silicon carbide and is passed through mercury electrodes at the ends of a deposition chamber.

EP 0 598 491 teaches that a layer of titanium carbide can be deposited on a tungsten core as an intermediate layer, an outer layer being of silicon carbide. Again, mercury electrodes are used at the ends of the deposition chamber.

These CVD techniques for producing coated filaments can be applied to different electrically conductive core materials capable of being heated electrically by the direct application of electrical current, or by induction, and to a range of coatings provided by an appropriate selection of reactive gas or gases.

SUMMARY OF THE INVENTION

We have found that these techniques for producing coated filaments inevitably result in mercury contamination of the coated filament. Such contamination occurs by the physical contact of the filament with liquid mercury forming the entry electrode, and by physical contact of the coating with liquid mercury forming the exit electrode. Further contamination occurs due to the production of mercury vapour by both of the electrodes. Some of this mercury vapour adheres to the filament as it approaches the deposition chamber and some adheres to the coating as the coated filament leaves the exit electrode. Mercury vapour also enters the deposition chamber and mingles with the gas or gases that produce the coating with the result that mercury may be incorporated within the coating. Mercury vapour additionally issues from the vicinity of both mercury pools and constitutes a potential health hazard. Similar problems occur with the use of liquid metal as the electrodes, for instance mercury/indium, mercury/cadmium or gallium/indium, in which case the contaminants would of course be mercury, indium, cadmium, and/or gallium.

As a result, the coated filament is compromised by contaminants which are on, within or under the coating. To some extent surface contaminants can be cleaned off the surface of the coating, but contaminants within or under the coating cannot readily be removed.

According to one aspect of the invention a filament coating apparatus to coat a filament in the absence of mercury, cadmium, indium or gallium, comprises a vertical deposition chamber in which a coating is to be applied to a filament to form a coated filament, an entrance electrode defines an entrance passage into the deposition chamber, and an exit electrode from the deposition chamber defines an exit passage, said entrance passage being shaped to permit the filament to slide into the deposition chamber whilst retaining direct electrical contact between the filament and said entrance passage, and said exit passage being shaped to permit the coated filament to slide out of the deposition chamber whilst retaining direct electrical contact between said coated filament and the exit passage. In this manner the filament can be coated without the use of liquid metal as the electrode and will not be contaminated by mercury, indium, cadmium or gallium.

A gas operable entrance passage sealing means may be provided to prevent gas escaping from the deposition chamber through the entrance passage, and a gas operable passage sealing means to prevent gas escaping from the deposition chamber through said exit passage.

A working clearance may be defined between the filament and the entrance passage, and said gas operable entrance passage sealing means may be a gas inlet operatively connected to supply gas to said working clearance at a pressure greater than an operational pressure within the deposition chamber. Alternatively, a working clearance may be defined between the filament and said entrance passage, and said gas operable entrance passage sealing means may be a gas exhaust to remove any gas leaking into said working clearance from the deposition chamber.

The gas operable sealing means for the exit passage preferably comprises a gas inlet to supply gas to a working clearance between the coated filament and the exit passage at a pressure greater than an operational pressure within the deposition chamber. Alternatively, the gas operable sealing means for the exit passage may comprise a gas exhaust to remove gas escaping from the deposition chamber through a working clearance between the coated filament and the exit passage.

The entrance passage is preferably formed as two intersecting misaligned passages having a cross-section that will allow the filament to slide through them whilst being pressed by their misalignment into direct electrical contact with the entrance passage. The exit passage is preferably formed as two intersecting misaligned passages having a cross-section that will allow the coated filament to slide through them whilst being pressed by their misalignment into direct electrical contact with the exit passage.

Preferably, the misaligned passages forming the entrance passage are positioned to guide the filament to the centre line of the deposition chamber, and the misaligned passages forming the exit passage are positioned to receive the coated filament from the centre line of the deposition chamber.

At least one of the passages may be defined by a capillary tube in electrical contact with the appropriate electrode. One or more of the capillary tubes may be detachable from its electrode.

The entrance and exit electrodes preferably form an electrical circuit for heating the filament to cause chemical vapour deposition of the coating from a gas or gases within the deposition chamber. Alternatively, at least one of the electrodes may form an electrostatic circuit to produce an electrostatic charge to cause physical vapour deposition of the coating from material within the deposition chamber.

According to another aspect of the invention a method of manufacturing a coated filament may include passing an electrically-conductive filament into a deposition chamber through an entrance passage in an entrance electrode, withdrawing the coated filament from the deposition chamber through an exit passage in an exit electrode, pressing the filament into direct electrical contact with the entrance passage and pressing the coated filament into direct electrical contact with the exit passage to establish an electrical heating circuit through the filament, and passing at least one thermally-reactive gas into the deposition chamber to form the coating by chemical vapour deposition (CVD). Alternatively, a method of manufacturing a coated filament may include passing an electrically-conductive filament into a deposition chamber through an entrance passage in an entrance electrode, withdrawing the coated filament from the deposition chamber through an exit passage in an exit electrode, pressing the filament against the wall of the entrance passage and the coated filament against the wall of the exit passage to establish an electrostatic circuit to cause physical vapour deposition (PVD) of the coating from material within the deposition chamber.

BRIEF DESCRIPTION OF THE DRAWINGS

The invention is now described, by way of example only, with reference to the accompanying drawings in which.

DETAILED DESCRIPTION OF THE INVENTION

Figure 1:
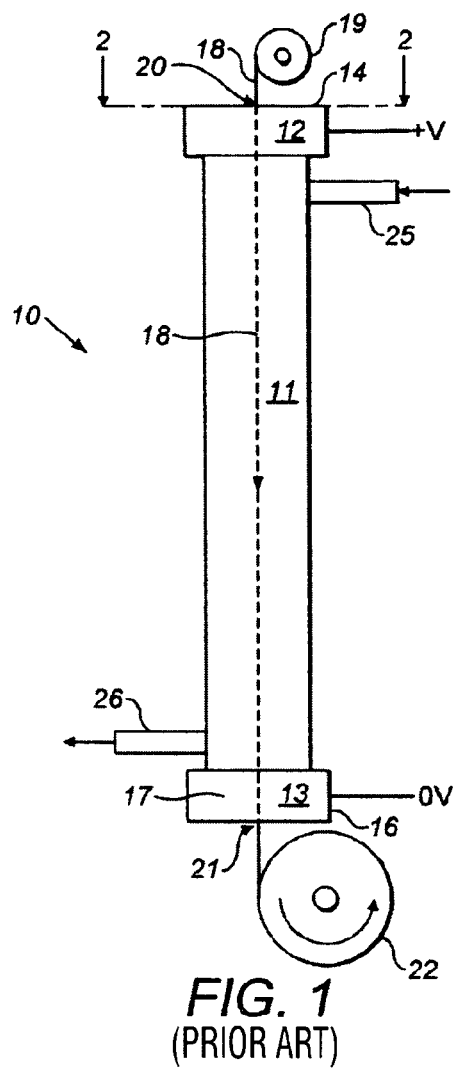
FIG. 1 is a diagrammatic side elevation of a known filament coating apparatus using chemical vapour deposition CVD.
Figure 2:
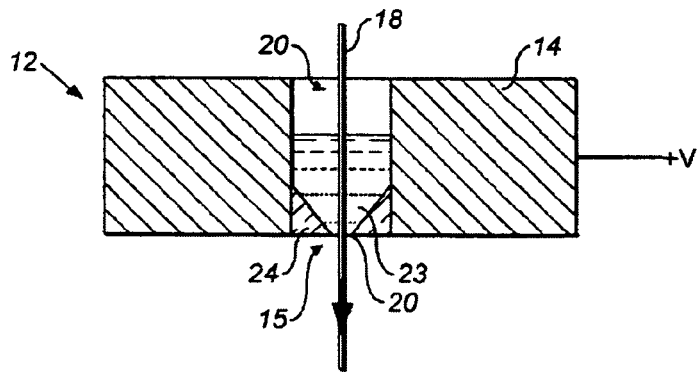
FIG. 2 is an enlarged vertical cross-section, taken on the line 2-2 in FIG. 1, illustrating a known combined entrance electrode and entrance sealing means.

With reference to FIGS. 1 and 2, a known construction of filament coating apparatus is indicated generally by arrow 10 and consists of a long vertical tube 11 closed by end plates 12 and 13. The tube 11 is about 4 meters long and may be made, for instance, from borosilicate glass, quartz glass, or of metal provided that it is insulated from the end plates 12, 13, or of ceramics. The upper end plate 12 acts as an entrance electrode 14 and as a housing for an entrance sealing means 15 as shown in FIG. 2. The lower end plate 13 acts as an exit electrode 16 and as a housing for an exit sealing means 17 which is of identical construction to the entrance sealing means 15.

A suitable electrically-conducting filament 18, for instance a tungsten wire or a carbon fibre, is fed from a supply spool 19, through an entrance passage 20 in the entrance electrode 14 into the longitudinal tube 11, and progresses through an exit passage 21 in the exit electrode 16 to a storage spool 22. The supply spool 19 and the storage spool 22 form parts of an otherwise unshown spooling mechanism which continually moves the filament 18 at an appropriate speed through the tube 11.

With reference to FIG. 2, the entrance electrode 14 is made of metal or glass and defines the upper and lower ends of the entrance passage 20 which are separated by a small reservoir 23 containing a pool of about 0.5 $cm^3$ of liquid mercury retained by surface tension in the much narrower lower end of the entrance passage 20, this has a diameter of typically 100-200 μm and is defined by a watchmaker's ruby or sapphire 24. The pool of liquid mercury has a dual function in forming a sealing means that allows the filament 18 to slide through the entrance passage 20 whilst providing indirect electrical contact between the end plate 12 and the filament 18. Instead of using mercury, other low melting point eutectics have been used.

A potential difference of typically 4 KV is applied across the electrodes 14, 16 to their respective mercury contacts with the filament 18 thereby causing a current to flow through the filament 18 and its coating to create a desired temperature rise, typically to between 800° C. and 1500° C. Reactive gases are passed into the tube 11 through an inlet 25, and exit through an outlet 26. These gases react at, or near, the hot surface of the filament 18 and deposit a coating of which the thickness increases as the filament passes through the tube 11. The coating thickness of the coated filament where it enters the exit passage 21 is typically 5-10 times the diameter of the filament. For this reason, the diameter of the exit passage 21 is correspondingly larger than that of the entrance passage 20. Apart from having a larger exit passage 21, the configuration and operation of the exit electrode 16 is identical to that already described with reference to the entrance electrode 14.

The coated filament has a variety of uses dependant on the composition of the coating, for instance the fabrication of high performance metal-matrix composites.

The use of mercury has several disadvantages due to its toxicity. Operators of such known filament coating apparatus inevitably come into physical contact with mercury vapour, and/or liquid mercury droplets, with the result that bodily levels of this toxin increase. Some of the mercury is transferred to the surface of the filament and to the coated filament by the liquid mercury in the reservoirs 23, and any mercury leaking into the tube 11 may become incorporated in the filament coating and/or be entrained in the waste gas exiting through the gas outlet 26 thereby necessitating precautions in its disposal. Traces of mercury on or in the coated filament are a potential hazard to users of the coated filament and could also adversely affect the physical properties of the coating, its adherence to the filament, and particularly its adherence to the metal in a metal-matrix composite.

Attempts have been made to replace the mercury with a variety of low-melting point eutectic alloys, but these all incur the release of associated toxins and suffer from equivalent disadvantages.

Figure 3:
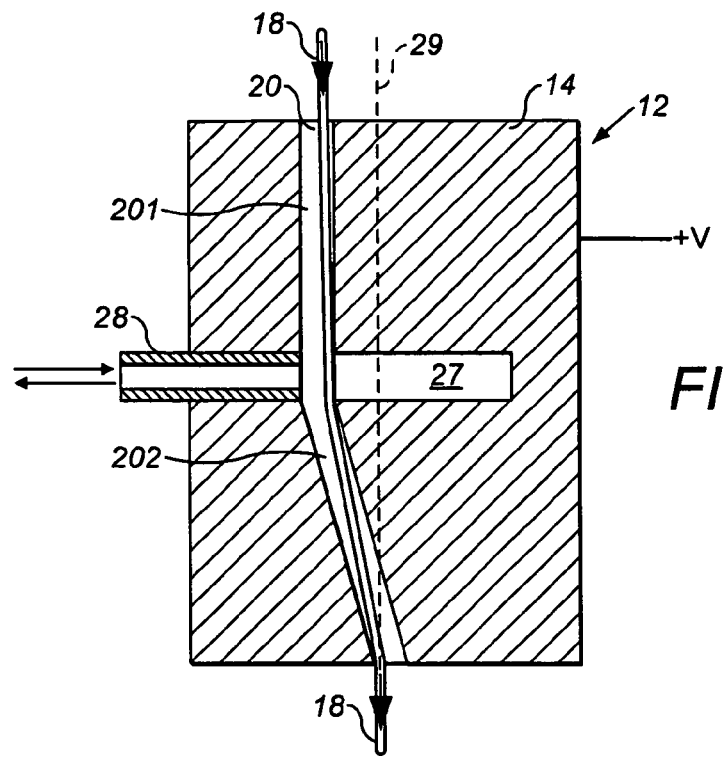
FIG. 3 is an enlarged vertical cross-section similar to FIG. 2 but illustrating an improved entrance electrode and entrance sealing means in accordance with the present invention.

With reference to FIG. 3, the present invention overcomes these disadvantages by modifying the end plate 12 to utilise an entrance sealing means that prevents the escape of reactive gas from the tube 11 past the end plate 12 without the use of mercury or any other low-melting point eutectic alloy, and to modify the end plate 12 to serve as the entrance electrode 14 again without the use of mercury or any other low-melting point alloy. These modifications to the upper end plate 12 are also incorporated in the lower end plate 13.

The end plate 12 is electrically conducting and is formed preferably from a metal, such as stainless steel, or from graphite. The entrance passage 20 has a small chamber 27 communicating with a tube 28 which is connected to an unshown waste gas disposal system having a gas pressure slightly less than the pressure of the reactive gases in the tube 11. In this manner the chamber 27 and the tube 28 act as an entrance sealing means by preventing any of the reactive gases from escaping to atmosphere through the working clearance between the filament 18 and the upper portion of the entrance passage 20. Alternatively, the tube 28 may supply an innocuous gas (for instance argon, or nitrogen, or some other gas appropriate to the coating process) under a pressure slightly greater than that in the tube 11, whereby the tube 28 and chamber 27 again act as an entrance sealing means. With either embodiment, the respective entrance sealing means isolates the reactive gases within the tube 11 from the surrounding atmosphere.

It will be noted from FIG. 3 that the entrance passage 20 is formed as two misaligned portions 201 and 202 of which the axes intersect in the region of the chamber 27. Each portion 201, 202 has an internal diameter that will provides a close sliding clearance for the filament 18 of which the diameter is typically between 20 μm and 200 μm. The upper portion 201 is displaced laterally (typically 1 mm or less) from a centre line 29 of the tube 11 whilst the lower portion 202 converges towards the centre line 29.

The filament 18 is deflected as it passes from the upper portion 201 into the misaligned lower portion 202 thereby ensuring excellent electrical contact between the filament 18 and the entrance passage 20. Good electrical contact is essential to avoid arcing.

Figure 4:
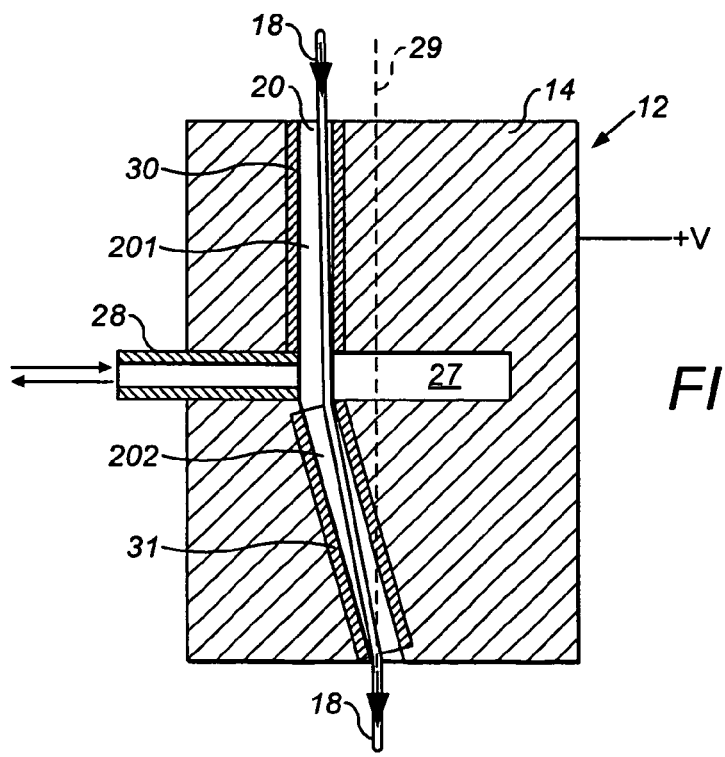
FIG. 4 illustrates a modification of FIG. 3.

In operation, the filament 18 can abrade its contact points in the upper and lower portions 201 and 202 of the entrance passage 20. Such abrasion will be minimal because typical spooling tensions are likely to be only of the order of 10 g or less. Over an extended period, such wear could necessitate replacement of the entire entrance electrode 14. However, this can be avoided by the modification shown in FIG. 4 in which the upper portion 201 and lower portion 202 of the entrance passage 20 are defined by separate straight capillary tubes 30 and 31 inserted in the entrance electrode 14. These capillary tubes 30 and 31 may conveniently be formed from standard capillary tube stock used in the manufacture of disposable hypodermic needles and could either be cast as inserts into the upper end plate 12, or fitted into bores formed to receive them. In the latter event, the capillary tubes 30 and 31 could be replaceable but would preferably be a press fit, or locked with a grub screw, in order to prevent arcing. The use of capillary tubes 30 and 31 formed from capillary tube stock has the added advantage that they are made of a much harder material than the entrance end plate 12 and will experience much less abrasive wear.

Instead of using two straight capillary tubes 30, 31 to form the misaligned portions 201 and 202, the entrance passage 20 could be defined by a single curved capillary tube cast as an insert into the end plate 12 with the aperture for mounting the tube 28 and the chamber 27 being subsequently machined in the end plate 12 to intersect such curved capillary tube to the extent necessary to provide communication between its bore and the tube 28. The use of a single curved capillary tube maximises electrical contact with the filament 18 and spreads potential wear over a larger contact area.

As already indicated, the construction and operation of the lower end plate 13 is generally identical to that just described for the upper end plate 12. The only point of difference is that the exit passage 21 in the lower end plate 12 is essentially of greater diameter to permit the much larger diameter of the coated filament to slide through it.

If desired, the longitudinal tube 11 could be sufficiently large to process several filaments 18 using either single end plates 12, 13 serving respectively as entrance and exit electrodes 14, 16, or could carry a separate pair of electrodes for each filament.

If desired, at least one of the reactive gases may be passed into the tube 11 through at least one of the end plates 12 or 13 and this gas may, for instance, be supplied through the tube 28. In this connection it should be noted that some of the reactive gases that may be used are innocuous within the environment inside the end plates 12, 13 whilst their reacted residues within the tube 11 must be kept away from the electrodes 14 and 16.

To this point the description has related to apparatus for, and methods of, chemically depositing a coating on a filament 18. The apparatus and method can also be applied to the physical deposition of a coating on a filament, for instance by sputtering, electrostatic painting or vacuum deposition. In such cases the electrodes 14 and 16 can form part of an electrostatic circuit to produce an appropriate electrostatic charge on the filament.

Although various embodiments of the invention have been shown and described herein, they are not meant to be limiting. Those of skill in the art may recognize certain modifications to these embodiments, which modifications are meant to be covered by the spirit and scope of the appended claims.

What is claimed is:

1. Filament coating apparatus to coat a filament in the absence of each of the liquid metals mercury, cadmium, indium and gallium, comprising:
   a vertical deposition chamber in which a coating is to be applied to a filament to form a coated filament;
   an entrance electrode defining an entrance passage through an upper wall of the deposition chamber; and
   an exit electrode defining an exit passage through a lower wall of the deposition chamber;
   said entrance passage being shaped to permit said filament to slide into said deposition chamber whilst retaining direct electrical contact between said filament and said entrance passage, and said exit passage being shaped to permit said coated filament to slide out of said deposition chamber whilst retaining direct electrical contact between said coated filament and said exit passage;
   said entrance and exit electrodes each being formed as a plate having capillary tubes inserted therein to form the entrance and exit passages, respectively, said capillary tubes being formed of a harder material than said plates.

2. Filament coating apparatus, as in claim 1, including entrance passage sealing means operable to prevent gas escaping from said deposition chamber through said entrance passage and exit passage sealing means operable to prevent gas escaping from said exit passage.

3. Filament coating apparatus, as in claim 2, in which a working clearance is defined between said filament and said entrance passage, and said entrance passage sealing means is a gas inlet operatively connected to supply gas to said working clearance at a pressure greater than operational pressure within said deposition chamber.

4. Filament coating apparatus, as in claim 2, in which a working clearance is defined between said filament and said entrance passage, and said entrance passage sealing means is a gas exhaust operatively connected to remove any gas leaking into said working clearance from said deposition chamber.

5. Filament coating apparatus, as in claim 2, in which a working clearance is defined between said coated filament and said exit passage, and said exit passage sealing means is a gas inlet operatively connected to supply gas to said working clearance at a pressure greater than an operational pressure within said deposition chamber.

6. Filament coating apparatus, as in claim 2, in which a working clearance is defined between said coated filament and said exit passage, and said exit passage sealing means is a gas exhaust operatively connected to said working clearance to remove any gas leaking into said working clearance from said deposition chamber.

7. Filament coating apparatus comprising:
  a deposition chamber in which a coating is to be applied to a filament to form a coated filament in the absence of each of the liquid metals mercury, cadmium, indium and gallium;
  an entrance electrode through a wall of the deposition chamber defining two intersecting misaligned passages;
  said two intersecting misaligned passages defining an entrance passage having a cross-section selected to permit said filament to slide into said deposition chamber;
  said misalignment of said two intersecting misaligned passages being selected to press said filament into direct electrical contact with said two intersecting misaligned passages; and
  an exit electrode through another wall of the deposition chamber defining an exit passage;
  said exit passage having a cross-section selected to permit said coated filament to slide out of said deposition chamber whilst retaining direct electrical contact between said coated filament and said exit passage.

8. Filament coating apparatus, as in claim 7, in which said entrance passage is positioned to guide said filament into alignment with a centre line of said deposition chamber, and said exit passage is positioned to receive said coated filament from said centre line.

9. Filament coating apparatus, as in claim 7, including a capillary tube defining at least one of said intersecting misaligned passages, said capillary tube being in electrical contact with the entrance electrode.

10. Filament coating apparatus, as in claim 9, in which said capillary tube is detachable from the entrance electrode.

11. Filament coating apparatus comprising:
  a deposition chamber in which a coating is to be applied to a filament to form a coated filament in the absence of each of the liquid metals mercury, cadmium, indium and gallium;
  an entrance electrode through a wall of the deposition chamber defining an entrance passage into the deposition chamber;
  said entrance passage having a cross-section selected to permit said filament to slide into said deposition chamber whilst retaining direct electrical contact between said filament and said entrance passage;
  an exit electrode defining two intersecting misaligned passages;
  said two interesting misaligned passages defining an exit passage having a cross-section selected to permit said coated filament to slide out of said deposition chamber, and said misalignment of said two intersecting misaligned passages being selected to press said coated filament into direct electrical contact with said two intersecting misaligned passages.

12. Filament coating apparatus, as in claim 11, including a capillary tube defining at least one of said intersecting misaligned passages, said capillary tube being in electrical contact with said coated filament.

13. Filament coating apparatus, as in claim 12, in which said capillary tube is detachable from said exit electrode.

\* \* \* \* \*